United States Patent
Zhao

(10) Patent No.: US 10,361,338 B2
(45) Date of Patent: Jul. 23, 2019

(54) TRANSFERRING DEVICE AND TRANSFERRING METHOD OF MICRO LIGHT EMITTING DIODE

(71) Applicant: Shenzhen China Star Optoelectronics Technology Co., Ltd., Shenzhen, Guangdong (CN)

(72) Inventor: Fenli Zhao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/761,810

(22) PCT Filed: Jan. 18, 2018

(86) PCT No.: PCT/CN2018/073292
§ 371 (c)(1),
(2) Date: Mar. 20, 2018

(87) PCT Pub. No.: WO2019/033708
PCT Pub. Date: Feb. 21, 2019

(65) Prior Publication Data
US 2019/0067510 A1  Feb. 28, 2019

(51) Int. Cl.
*H01L 21/677* (2006.01)
*H01L 33/00* (2010.01)
(Continued)

(52) U.S. Cl.
CPC ........ *H01L 33/005* (2013.01); *B25J 15/0608* (2013.01); *H01L 21/67709* (2013.01); *H01L 33/0095* (2013.01); *H01L 2224/95085* (2013.01)

(58) Field of Classification Search
CPC .. B25J 15/0076; B25J 15/008; B25J 15/0246; B25J 15/0608; H01L 21/67709; H01L 33/005; H01L 33/0095; H01L 2224/95085
(Continued)

(56) References Cited

U.S. PATENT DOCUMENTS 5,452,932 A * 9/1995 Griffin ..................... B25J 15/00
294/216
6,280,799 B1 * 8/2001 Okabe ..................... B05C 5/001
427/261

(Continued)

FOREIGN PATENT DOCUMENTS

CN          1668418 A      9/2005
CN       103909040 A      7/2014
(Continued)

*Primary Examiner* — Dean J Kramer
(74) *Attorney, Agent, or Firm* — Andrew C. Cheng

(57) ABSTRACT

Provided are a transferring device and a transferring method of a micro light emitting diode. During the transferring process of the micro light emitting diode, the state of the magnetorheological fluid is controlled to achieve the physical connection of the micro light emitting diode and the transferring head to increase the acting force between the micro light emitting diode and the transferring head, thereby preventing damage during the transfer process of the micro light emitting diode for reducing the difficulty of transferring the light emitting diode. Moreover, with the simple electromagnetic device to control the connection and separation of the micro light emitting diode and the transferring head, the transferring operation of the micro light emitting diode is simplified to promote the transferring efficiency of the micro light emitting diode.

7 Claims, 3 Drawing Sheets

(51) Int. Cl.
*B25J 15/00* (2006.01)
*B25J 15/06* (2006.01)
(58) Field of Classification Search
USPC .................................... 294/65.5, 212, 216
See application file for complete search history.

(56) References Cited

U.S. PATENT DOCUMENTS

| 9,308,650 B2 * | 4/2016 | Eisele .................. B25J 15/0071 |
| 2016/0052147 A1 * | 2/2016 | Spicer .................. B25J 15/0608 |
| | | 269/8 |

FOREIGN PATENT DOCUMENTS

| CN | 105493298 A | 4/2016 | |
| CN | 107527973 A | 12/2017 | |
| DE | 10209783 A1 * | 9/2003 | ............. B23Q 3/086 |

* cited by examiner

TRANSFERRING DEVICE AND TRANSFERRING METHOD OF MICRO LIGHT EMITTING DIODE

CROSS REFERENCE

This application claims the priority of Chinese Patent Application No. 201710704461.0, filed on Aug. 16, 2017, the disclosure of which is incorporated herein by reference in its entirety.

FIELD OF THE INVENTION

The present invention relates to a display field, and more particularly to a transferring device and a transferring method of a micro light emitting diode.

BACKGROUND OF THE INVENTION

Magnetorheological fluid (MRF) is a new type of smart fluid material. Under the action of magnetic field, MRF can change from a liquid state to a solid state. When the applied magnetic field is removed, MRF can quickly return to the liquid state. Because of this unique nature of MRF, it is widely used in the field of precision machining.

In the field of micro LED display (Micro LED), in order to manufacture a light emitting diode display, the micro light emitting diodes need to be transferred from an original substrate to the receiving substrate to be aligned in array, which involves precision transferring issues of a huge amount of micro light emitting diodes. In prior art, the micro light emitting diode is generally adsorbed onto a transferring head by electrostatic adsorption and is transferred to the receiving substrate. However, the adsorption capacity of electrostatic adsorption is smaller. The micro light emitting diodes are easily damaged so that the transferring difficulty is high during the transferring process. Moreover, the efficiency of electrostatic adsorption is low.

SUMMARY OF THE INVENTION

The present invention provides a transferring device and a transferring method of a micro light emitting diode to reduce the difficulty of transferring the light emitting diode and to improve the transferring efficiency.

The transferring device comprises a moving part and a transferring head movably connected with the moving part, wherein the transferring head comprises a housing, magnetorheological fluid filled in the housing and an electromagnetic device provided on the housing, wherein the electromagnetic device generates a magnetic field, the magnetorheological fluid is located in the magnetic field, and the housing comprises a fluid outlet hole and the magnetorheological fluid flows out from the fluid outlet hole.

The electromagnetic device comprises an electromagnet or an electromagnetic coil, and a control unit electrically connected with the electromagnet or the electromagnetic coil, the control unit controls generation and elimination of a magnetic field of the electromagnet or the electromagnetic coil and controls a magnitude and a duration of the magnetic field generated by the electromagnet or the electromagnetic coil.

The electromagnet or the electromagnetic coil is provided inside or outside the housing.

The electromagnet or the electromagnetic coil is the housing.

The magnetorheological fluid is a liquid state in a natural state and is a solid state under an action of the magnetic field.

The transferring device comprises a plurality of transferring heads, wherein the plurality of the transferring heads are disposed at intervals.

The present invention further provides a transferring method of a micro light emitting diode, comprising steps of:

providing the aforesaid transferring device;

moving a transferring head of the transferring device to a micro light emitting diode on a first substrate to move the fluid outlet hole of the transferring head close to the micro light emitting diode; controlling the magnetorheological fluid in a liquid state to flow out from the fluid outlet hole to cover the micro light emitting diode;

controlling the electromagnetic device to generate a magnetic field to change the magnetorheological fluid from the liquid state to a solid state such that the micro light emitting diode adheres to the transferring head with the magnetorheological fluid;

moving the micro light emitting diode to a second substrate;

eliminating the magnetic field generated by the electromagnetic device to change the magnetorheological fluid from the solid state to the liquid state such that the micro light emitting diode is separated from the transferring head.

The control unit electrically connected to the electromagnetic device controls on and off of the electromagnetic device to achieve generation and elimination of the magnetic field of the electromagnetic device.

A distance between the fluid outlet hole of the transferring head and the micro light emitting diode on the first substrate is 1 μm to 3 μm as the fluid outlet hole of the transferring head is close to the micro light emitting diode on the first substrate.

The transferring device comprises a plurality of transferring heads to transfer the plurality of micro light emitting diodes at the same time.

With the transferring device and the transferring method of the micro light emitting diode provided by the present invention, the magnetorheological fluid is filled in the housing and the electromagnetic device controls the state of the magnetorheological fluid. As the transferring head is close to the micro light emitting diode, the magnetorheological fluid is the liquid state and covers the micro light emitting diode; then, the magnetorheological fluid is controlled to be the solid state to achieve the connection of the micro light emitting diode and the transferring head; and then, the micro light emitting diode is transferred onto the second substrate and the magnetic field of the electromagnetic device is eliminated to separate the micro light emitting diode from the transferring head such that transferring the micro light emitting diode from the first substrate onto the second substrate can be realized. During the transferring process of the micro light emitting diode, the physical connection of the micro light emitting diode and the transferring head is implemented with the magnetorheological fluid to increase the acting force between the micro light emitting diode and the transferring head, thereby preventing damage during the transfer process of the micro light emitting diode for reducing the transferring difficulty and increasing the transferring efficiency of the light emitting diode.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

The present invention provides a transferring device. The transferring device can be used to transfer various mini components such as a chip, a miniature substrate and a patch. In this embodiment, the transferring device is mainly used to transfer the micro light emitting diode during the manufacturing process of the micro light emitting diode display.

Figure 1:
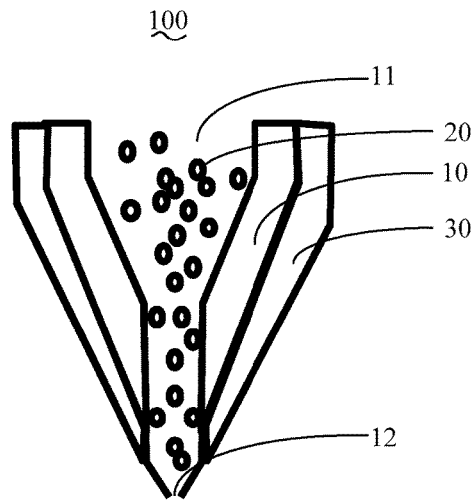
FIG. 1 is diagram of a transferring head according to the embodiment of the present invention.

Please refer to FIG. 1. The present invention provides a transferring device 100. In this embodiment, the transferring device 100 is used to transfer a micro light emitting diode 210 arranged on a first substrate 220 onto a second substrate 230. The first substrate 220 is an original substrate and the micro light emitting diode 210 is on the first substrate 220; the second substrate 230 is a accepting substrate, which requires the micro light emitting diode 210. The transferring device 100 comprises a moving part (not shown) and a transferring head movably connected to the moving part. The moving part can drive the transferring head to move on a horizontal plane of the transfer head. The transferring head is movably connected to the moving part. The transferring head is capable of achieving a vertical movement relative to the moving part. A plurality of transferring heads is provided. The plurality of the transferring heads is disposed at intervals and is connected to the moving part. Each of the transferring heads can move one of the micro light emitting diodes 210. Thus, the plurality of the transferring heads is capable of transferring a plurality of micro light emitting diodes 210 at the same time. The transferring head comprises a housing 10, magnetorheological fluid 20 filled in the housing 10 and an electromagnetic device 30 provided on the housing 10.

The housing 10 is a cavity piece including a cavity 11. The housing 10 comprises a cylindrical portion and a conical portion connected to the cylindrical portion. The cylindrical portion is disposed coaxially with the conical portion and has the same bottom size as the conical portion. A fluid outlet hole 12 is configured at the top of the conical portion of the housing 10. The cavity 11 communicates with the outside through a fluid outlet hole 12. In another embodiment of the present invention, a control switch is further configured on the housing 10. The control switch is close to the fluid outlet hole 12 to control whether the magnetorheological fluid 20 flows out of the fluid outlet hole 12 with the control switch. Specifically, the control switch is turned on as the magnetorheological fluid 20 is not required to flow out of the fluid outlet hole 12; the control switch is turned off as the magnetorheological fluid 20 is required to flow out of the fluid outlet hole 12.

The magnetorheological fluid 20 is filled in the cavity 11 of the housing 10. The magnetorheological fluid 20 is a liquid state in a natural state and can be changed from the liquid state to a solid state under an action of the magnetic field. Without the action of the magnetic field, the magnetorheological fluid can flow out of the fluid outlet hole. The electromagnetic device 30 comprises an electromagnet or an electromagnetic coil, and a control unit electrically connected with the electromagnet or the electromagnetic coil. The electromagnet or the electromagnetic coil can generate a magnetic field under a power-on condition and the magnetic field generated by the electromagnetic coil disappears when the power is off. In this embodiment, the electromagnetic device 30 comprises an electromagnetic coil. The electromagnetic coil is wound around an outer wall of the housing 10 such that the magnetorheological fluid 20 is located in the magnetic field generated by the electromagnetic coil. Then, the state of the magnetorheological fluid is controlled by controlling the magnetic field generated by the electromagnetic coil. It can be understood that the electromagnetic coil can also be disposed in the cavity 11 of the housing 10 such as the inner wall of the housing 10. Alternatively, in other embodiments of the present invention, the electromagnetic coil or the electromagnet can also be the housing 10 of the transferring head so that the state of the magnetorheological fluid 20 can be better controlled.

The electromagnetic device 30 further comprises a control unit. The control unit is connected to the electromagnetic coil or the electromagnet. The control unit controls on and off of the electromagnetic coil or the electromagnet to control generation and elimination of the magnetic field of the electromagnetic coil or the electromagnet. Furthermore, by controlling a magnitude of the amount of electricity supplied to the electromagnet or the electromagnetic coil and a duration of electrification with the control unit, the magnitude and the duration of the magnetic field generated by the electromagnet or the electromagnetic coil can be controlled. In this embodiment, as the transferring device 100 is not required to transfer the micro light emitting diodes 210, the control unit controls the electromagnet or the electromagnetic coil to constantly be in the electrified state to ensure that the magnetorheological fluid in the housing 10 of the transferring head is the solid state to prevent the magnetorheological fluid from flowing out of the housing 10 of the transferring head. In another embodiment of the present invention, a control switch is configured on the housing 10 of the transferring device 100. As the transferring device 100 is not required to transfer the micro light emitting diodes 210, the control switch can control the electromagnet or the electromagnetic coil to constantly be in the power off state to prevent the magnetorheological fluid from flowing out of the housing 10 of the transferring head by turning off the control switch and to achieve the objective of saving power.

As transferring the micro light emitting diodes 210, the moving part drives the transferring head to a position of the micro light emitting diodes 210, which needs to be transferred, on the first substrate 220 and adjusts the transferring head close to the micro light emitting diodes 210 such that the magnetorheological fluid in the fluid state flows on the micro light emitting diodes 210 and partially covers the micro light emitting diodes 210. In this embodiment, a distance between the fluid outlet hole 12 of the transferring head and the micro light emitting diode 210 on the first substrate 220 is 1 μm to 3 μm as the transferring head is close to the micro light emitting diode 210. Then, the control units controls the electromagnetic device to generate a magnetic field to change the magnetorheological fluid 20 from the liquid state to the solid state to achieve the connection of the micro light emitting diode 210 with the transferring head. Then, the moving part is moved again to a position of the second substrate 230 and the transferring head is moved in a vertical direction so that the micro light emitting diode 210 is moved onto the second substrate 230. Then, the magnetic field of the electromagnetic device is eliminated by the control device such that the micro light emitting diode 210 is separated from the transferring head to transfer the micro light emitting diode 210 from the first substrate 220 onto the second substrate 230. Moreover, after the micro light emitting diode 210 is transferred from the first substrate 220 onto the second substrate 230, the magnetorheological fluid 20 remaining on the micro light emitting diode 210 can be removed and recovered by a simple process. As an illustration, the magnetorheological fluid 20 remaining on the micro light emitting diode 210 can be blown to a collecting tank by means of an air knife and the collected magnetorheological fluid 20 can be further recovered and recycled to reduce waste matter and to reduce the cost.

Figure 2:
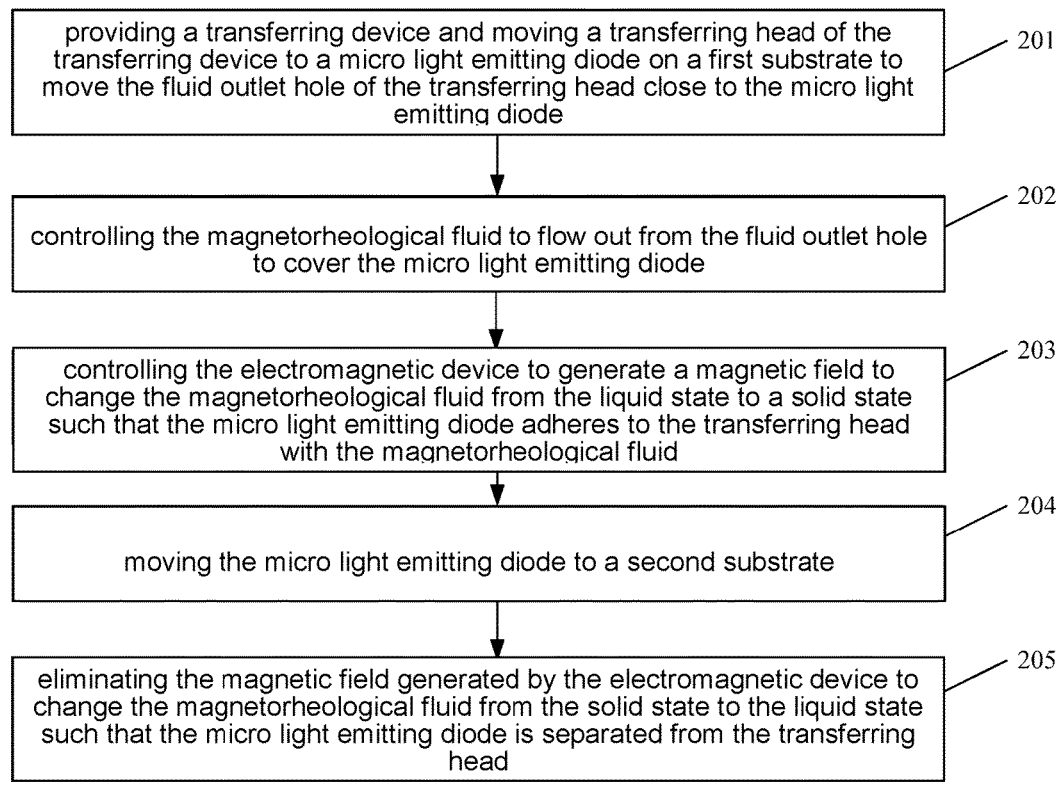
FIG. 2 is a flowchart of a transferring process of a micro light emitting diode according to the embodiment of the present invention.
Figure 3:
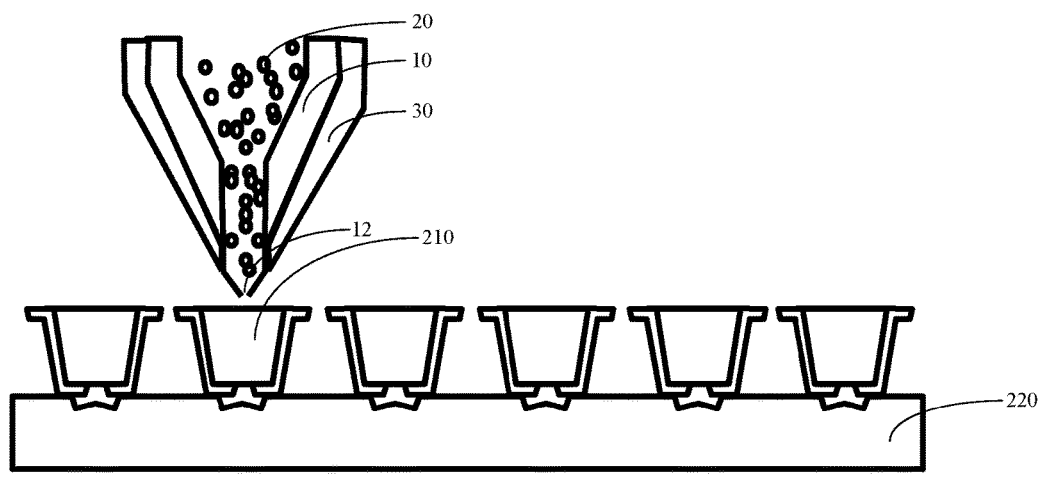
FIG. 3 to FIG. 6 are diagrams of respective steps of a transferring process of a micro light emitting diode according to the embodiment of the present invention.

Please refer to FIG. 2. The present invention further provides a transferring method of a micro light emitting diode 210, comprising steps of:

step 210, referring to FIG. 3, providing the aforesaid transferring device 100, and moving a transferring head of the transferring device to a position of a micro light emitting diode 210 on a first substrate 220 to move the fluid outlet hole 12 of the transferring head close to the micro light emitting diode 210.

Figure 4:
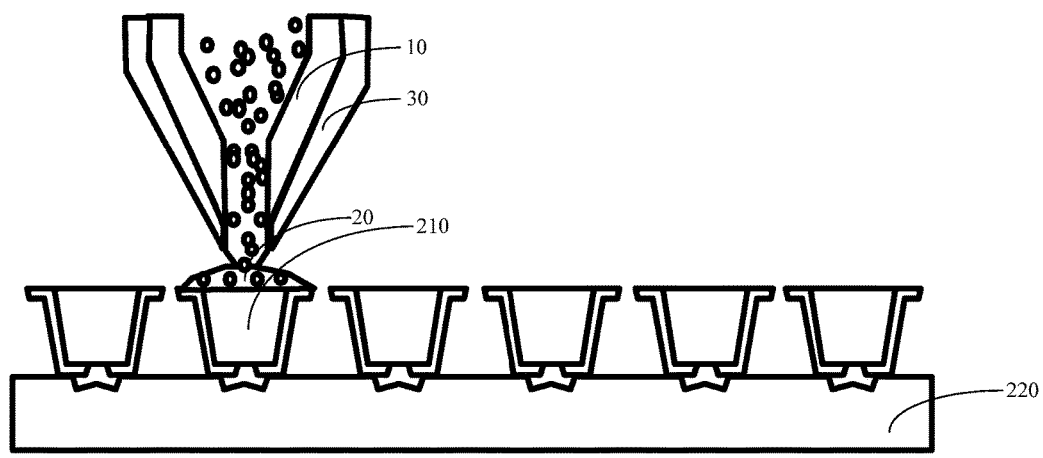

The moving part drives the transferring head to a position of the micro light emitting diodes 210, which needs to be transferred, on the first substrate 220 and adjusts the transferring head close to the micro light emitting diodes 210 such that the fluid outlet hole 12 of the transferring head is close to the micro light emitting diodes 210. In this embodiment, a distance between the fluid outlet hole 12 of the transferring head and the micro light emitting diode 210 on the first substrate 220 is 1 μm to 3 μm as the transferring head is close to the micro light emitting diode 210. It can be understood that a plurality of transferring heads can be configured to transfer a plurality of micro light emitting diodes 210 with the plurality of transferring heads at the same time as the plurality of micro light emitting diodes 210 needs to be transferred. In this embodiment, the electromagnet or the electromagnetic coil of the electromagnetic device 30 to be in the electrified state such that the magnetorheological fluid 20 is the solid state now to not to flow out of the fluid outlet hole 12. In another embodiment of the present invention, a control switch is configured on the housing 10 of the transferring head. The electromagnet or the electromagnetic coil can be in the power off state to prevent the magnetorheological fluid from flowing out of the housing 10 of the transferring head by turning off the control switch.

step 202, referring to FIG. 4, controlling the magnetorheological fluid 20 in a liquid state to flow out from the fluid outlet hole 12 to cover the micro light emitting diode 210.

controlling the electromagnet or the electromagnetic coil of the electromagnetic device 30 to be in the power off state to change the magnetorheological fluid 20 in a liquid state such that the magnetorheological fluid 20 naturally flows out of the fluid outlet hole 12 and covers the micro light emitting diode 210. In another embodiment of the present invention, the control switch can be directly turned on so that the magnetorheological fluid flows out of the fluid outlet hole 12. The magnetorheological fluid 20 only needs to partially cover the micro light emitting diode 210 to reduce the using volume of the magnetorheological fluid 20 as possible while ensuring the connection strength between the micro light emitting diode 210 and the transferring head.

step 203, controlling the electromagnetic device 30 to generate a magnetic field to change the magnetorheological fluid 20 from the liquid state to the solid state such that the micro light emitting diode 210 adheres to the transferring head with the magnetorheological fluid 20.

Figure 5:
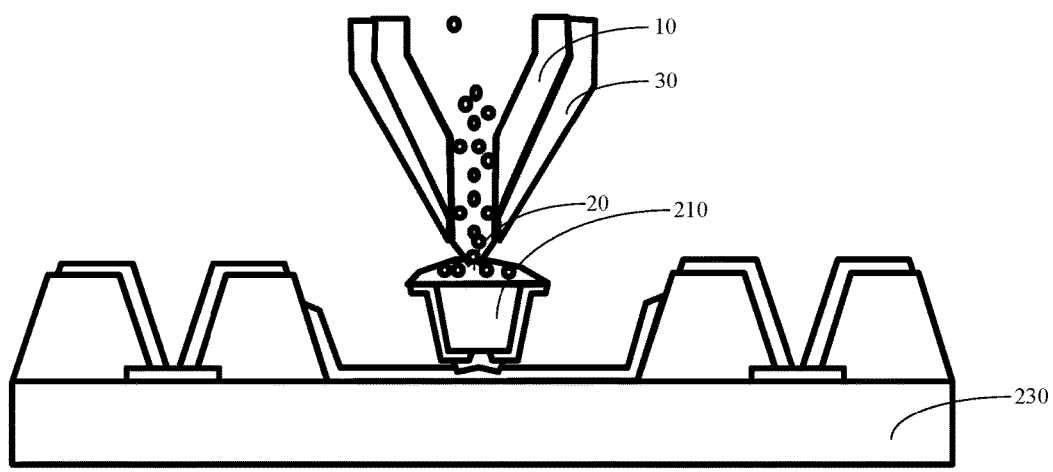

The control unit electrifies the electromagnetic device 30 such that the electromagnetic device 30 generates the magnetic field. The control unit controls the magnitude of the amount of supplying electricity to control the strength of the magnetic field generated by the electromagnetic device 30. The magnetorheological fluid 20 is affected by the magnetic field to change from the liquid state to the solid state. Thus, the micro light emitting diode 210 and the transferring head are connected with the magnetorheological fluid in the solid state to achieve the physical connection of the micro light emitting diode 210 and the transferring head with the magnetorheological fluid in the solid state. Then, the acting force between the micro light emitting diode 210 and the transferring head is increased to prevent damage during the transfer process of the micro light emitting diode 210 and to reduce the transferring difficulty of the micro light emitting diode 210.

step 204, referring to FIG. 5, moving the micro light emitting diode 210 to the second substrate 230.

Figure 6:
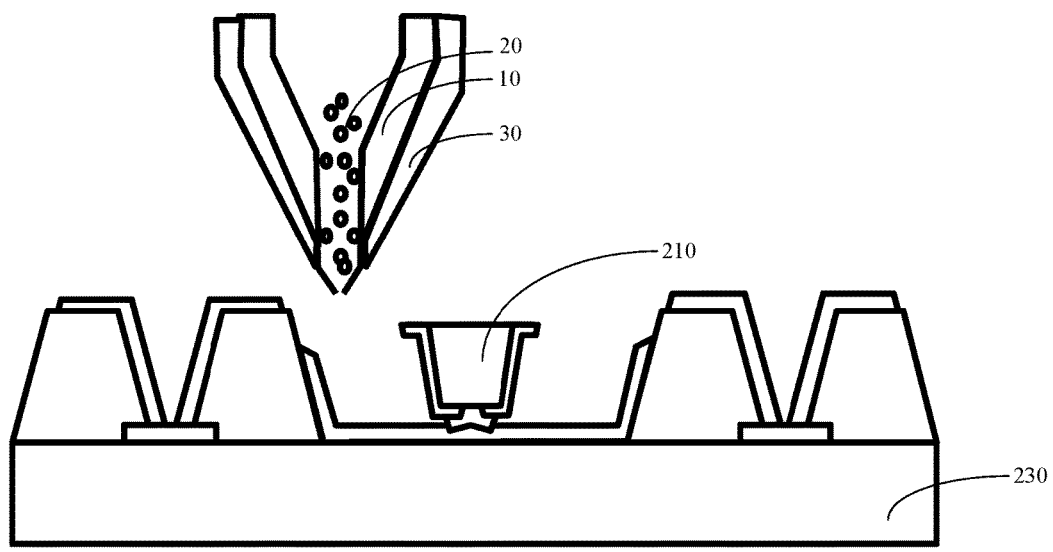

The moving part drives the transferring head adhered with the micro light emitting diode 210 to a position above the second substrate 230. Then, the transferring head can drive the micro light emitting diode 210 to move. Then, the transferring head is moved in a vertical direction so that the micro light emitting diode 210 is moved onto the second substrate 230.

step 205, referring to FIG. 6, eliminating the magnetic field generated by the electromagnetic device 30 to change the magnetorheological fluid 20 from the solid state to the liquid state such that the micro light emitting diode 210 is separated from the transferring head.

By cutting off the power of the electromagnetic device 30 or reducing a magnitude of the amount of electricity supplied to the electromagnetic device 30 with the control unit to eliminate or decrease the magnetic field generated by the electromagnetic device 30, the magnetorheological fluid 20 is changed from the solid state to the liquid state such that the micro light emitting diode 210 is separated from the transferring head. The micro light emitting diode 210 is transferred onto the second substrate 230.

In the present invention, during the transferring process of the micro light emitting diode 210, the physical connection of the micro light emitting diode 210 and the transferring head is conducted with the magnetorheological fluid 20 to increase the acting force between the micro light emitting diode 210 and the transferring head, thereby preventing damage during the transfer process of the micro light emitting diode 210 for reducing the transferring difficulty. Moreover, with the simple electromagnetic device to control the connection and separation of the micro light emitting diode 210 and the transferring head, the transferring operation of the micro light emitting diode 210 is simplified to promote the transferring efficiency of the micro light emitting diode 210.

Above are embodiments of the present invention, which does not limit the scope of the present invention. Any modifications, equivalent replacements or improvements within the spirit and principles of the embodiment described above should be covered by the protected scope of the invention.

What is claimed is:

1. A transferring method of a micro light emitting diode, comprising steps of:
   providing a transferring device, comprising a moving part and a transferring head movably connected with the moving part, wherein the transferring head comprises a housing, magnetorheological fluid filled in the housing and an electromagnetic device provided on the housing, wherein the electromagnetic device generates a magnetic field, the magnetorheological fluid is located in the magnetic field, and the housing comprises a fluid outlet hole and the magnetorheological fluid flows out from the fluid outlet hole;
   moving a transferring head of the transferring device to a micro light emitting diode on a first substrate to move the fluid outlet hole of the transferring head close to the micro light emitting diode;
   controlling the magnetorheological fluid in a liquid state to flow out from the fluid outlet hole to cover the micro light emitting diode;
   controlling the electromagnetic device to generate a magnetic field to change the magnetorheological fluid from the liquid state to a solid state such that the micro light emitting diode adheres to the transferring head with the magnetorheological fluid;
   moving the micro light emitting diode to a second substrate;
   eliminating the magnetic field generated by the electromagnetic device to change the magnetorheological fluid from the solid state to the liquid state such that the micro light emitting diode is separated from the transferring head.

2. The transferring method of the micro light emitting diode according to claim 1, wherein a control unit electrically connected to the electromagnetic device controls on and off of the electromagnetic device to achieve generation and elimination of the magnetic field of the electromagnetic device.

3. The transferring method of the micro light emitting diode according to claim 1, wherein a distance between the fluid outlet hole of the transferring head and the micro light emitting diode on the first substrate is 1 μm to 3 μm as the fluid outlet hole of the transferring head is close to the micro light emitting diode on the first substrate.

4. The transferring method of the micro light emitting diode according to claim 1, wherein the electromagnetic device comprises an electromagnet or an electromagnetic coil, and a control unit electrically connected with the electromagnet or the electromagnetic coil, the control unit controls generation and elimination of the magnetic field of the electromagnet or the electromagnetic coil and controls a magnitude and a duration of the magnetic field generated by the electromagnet or the electromagnetic coil.

5. The transferring method of the micro light emitting diode according to claim 4, wherein the electromagnet or the electromagnetic coil is provided inside or outside the housing.

6. The transferring method of the micro light emitting diode according to claim 4, wherein the electromagnet or the electromagnetic coil is the housing.

7. The transferring method of the micro light emitting diode according to claim 1, wherein the magnetorheological fluid is the liquid state in a natural state and is the solid state under an action of the magnetic field.

\* \* \* \* \*